United States Patent
García González et al.

(10) Patent No.: US 9,966,912 B2
(45) Date of Patent: May 8, 2018

(54) AMPLIFIER CIRCUIT AND AMPLIFIER ARRANGEMENT

(71) Applicant: ams AG, Unterpremstaetten (AT)

(72) Inventors: José Manuel García González, Paterna (ES); Andreas Fitzi, Staefa (CH)

(73) Assignee: ams AG, Unterpremstaetten (AT)

( * ) Notice: Subject to any disclaimer, the term of this patent is extended or adjusted under 35 U.S.C. 154(b) by 0 days. days.

(21) Appl. No.: 15/521,281

(22) PCT Filed: Aug. 20, 2015

(86) PCT No.: PCT/EP2015/069158
§ 371 (c)(1),
(2) Date: Apr. 21, 2017

(87) PCT Pub. No.: WO2016/062429
PCT Pub. Date: Apr. 28, 2016

(65) Prior Publication Data
US 2017/0310291 A1 Oct. 26, 2017

(30) Foreign Application Priority Data
Oct. 23, 2014 (EP) ..................................... 14190129

(51) Int. Cl.
*H03F 3/45* (2006.01)
*H03F 1/22* (2006.01)
*H03F 3/30* (2006.01)

(52) U.S. Cl.
CPC ......... *H03F 3/45215* (2013.01); *H03F 1/223* (2013.01); *H03F 3/3022* (2013.01);
(Continued)

(58) Field of Classification Search
CPC ........ H03F 3/45215; H03F 1/223; H03F 3/45; H03F 3/45179; H03F 3/45183;
(Continued)

(56) References Cited

U.S. PATENT DOCUMENTS

| | | | | |
|---|---|---|---|---|
| 7,688,143 B2 * | 3/2010 | Kimura | ............... | H03F 3/45179 330/253 |
| 2010/0311378 A1 * | 12/2010 | Tasic | ...................... | H03F 3/195 455/296 |

(Continued)

FOREIGN PATENT DOCUMENTS

EP        2879292 A1     12/2016

OTHER PUBLICATIONS

Lopez-Martin, A, et al.: "Low-Voltage Super Class AB CMOS OTA Cells With Very High Slew Rate and Power Efficiency"; IEEE Journal of Solid-State Circuits, vol. 40, No. 5, May 2005.

(Continued)

*Primary Examiner* — Khanh V Nguyen
(74) *Attorney, Agent, or Firm* — McDermott Will & Emery LLP

(57) ABSTRACT

An amplifier circuit with a differential input and a differential output comprises a first and a second pair of matched transistors having a first threshold voltage and comprising control terminals connected to the differential input. A first and a second pair of triplets of transistors having a second threshold voltage being different from the first threshold voltage is connected to each one of the pairs of matched transistors such that respective current paths are formed with these transistors. The currents are split up to bias current sources and to an output stage such that the current is reused for implementing a class AB operation. Furthermore, a current through bias transistors connected in the current path of the first and the second pair of matched transistors is mirrored to output transistors being arranged in a differential current path of the output stage.

13 Claims, 2 Drawing Sheets

(52) U.S. Cl.
CPC ...... *H03F 3/45071* (2013.01); *H03F 3/45179* (2013.01); *H03F 3/45183* (2013.01); *H03F 2200/411* (2013.01); *H03F 2203/45116* (2013.01)

(58) Field of Classification Search
CPC ............ H03F 3/45188; H03F 3/45192; H03F 2200/177; H03F 1/307; H03F 3/30; H03F 3/3001; H03F 3/3022; H03F 2203/30009; H03F 3/45071
USPC .................................. 330/253, 255, 257, 261
See application file for complete search history.

(56) References Cited

U.S. PATENT DOCUMENTS

| | | | |
|---|---|---|---|
| 2011/0037518 A1* | 2/2011 | Lee | H03F 1/223 330/253 |
| 2011/0304392 A1* | 12/2011 | Zanchi | H03F 1/3211 330/253 |

OTHER PUBLICATIONS

Lopez-Morillo, E, et al.: "A Very Low-Power Class AB/AB Op-amp based Sigma-Delta Modulator for Biomedical Applications"; 49th IEEE International Midwest Symposium, Aug. 2006, pp. 458-462.
Padilla I, et al.: "Low Voltage Rail-to-Rail Operational Amplifier Based on flipped Voltage Followers"; 48th Midwest Symposium on Circuits ans Systems, Aug. 2005, pp. 267-270.
Thoutam, S. et al.: "Power efficient fully differential low-voltage two stage class AB/AB Op-amp architectures"; IEEE International Symposium on Circuits and Systems, May 2004, pp. I-733-I-736.
Baswa S. et al.: "Low-voltage micropower super class AB CMOS OTA"; Electronic Letters, vol. 40., No. 4, Feb. 2004.
Bult, Klaas et al.: "A Fast-Settling CMOS OP Amp for SC Circuits with 90-dB DC Gain"; IEEE Journal of Solis-State Circuits 1990, vol. 25, No. 6, pp. 1379-1384.
Ramirez-Angulo, J. et al.: "Low-Power Low-Voltage Analog Electronic Circuits Using the flipped Voltage Follower"; IEEE International Symposium Jul. 2002, vol. 4 pp. 1327-1330.
Yavari, Mohammad et al.: "A novel fully-differential class AB folded-cascode OTA"; IEICE Elecgtronic Express, vol. 1 No. 13, pp. 358-362.

* cited by examiner

AMPLIFIER CIRCUIT AND AMPLIFIER ARRANGEMENT

BACKGROUND OF THE INVENTION

The present application relates to an amplifier circuit and an amplifier arrangement with such amplifier circuit. The application further relates to the use of such amplifier circuit.

BACKGROUND OF THE INVENTION

Amplifier circuits and amplifier arrangements, for example operational amplifiers, are currently used in a wide field of applications. Operational amplifiers, when implemented in integrated circuits, regularly comprise one or more differential pairs of transistors. For example, unity-gain frequency, gain-bandwidth product, slew-rate, DC gain, noise and current consumption are terms closely related in amplifiers and are the most important parameters. E.g., the faster the amplifier shall be, the more current is necessary.

However, especially in today's growing market for low power amplifiers in mobile devices, there is a need for amplifiers that can be integrated in a semiconductor device and that achieve both reduced current consumption and increased performance.

SUMMARY OF THE INVENTION

The present application provides an improved amplifier concept that provides less power consumption at given speed requirements, or increased speed performance at given power consumption, or both.

The improved amplifier concept is based on the idea to take a first and a second pair of differential input transistors, one acting as a differential stage and the other acting as a class AB stage. A current-based boost scheme is used to enhance the class AB operation. This current-based boost scheme is based in the reuse of the current flowing through the main input differential pair to speed up the charging and discharging of the nodes controlling the class AB operation. The splitting of the current through a differential pair is done by means of transistors with different threshold voltages. Particularly, the main differential pair is cross-coupled with two voltage sources, preferably constant voltage sources, that comprise the other differential pair. The current flowing through each transistor of the main differential pair and the other differential pair is split by a respective triplet of transistors acting as voltage controlled current sources, such that a second differential stage is formed for both the main differential pair and the other differential pair.

In each triplet one of the transistors is connected to a differential current path of an output stage and one transistor is connected to a respective bias current source being part of the voltage sources. The third transistor in each triplet performs a cross-coupling between the differential pairs. The boost scheme according to the improved amplifier concept reduces the current consumption of the amplifier or improves the gain bandwidth product and slew rate for the same current consumption, or both.

In an embodiment of an amplifier circuit according to the improved amplifier concept, the amplifier circuit has a differential input and a differential output arranged in a differential current path of an output stage. The amplifier circuit comprises a first pair of matched transistors having a first threshold voltage and comprising control terminals connected to the differential input. The amplifier circuit further comprises a second pair of matched transistors having the first threshold voltage and comprising control terminals connected to the differential input. Said second pair of matched transistors is part of voltage sources cross-coupling said first pair of matched transistors. For example, the first and the second pair of matched transistors together form a first differential stage.

A first pair of triplets of transistors having a second threshold voltage being different from the first threshold voltage is provided in the amplifier circuit. The transistors of each of those triplets is commonly connected to a respective dedicated transistor of the first pair of matched transistors such that a respective current path is formed with the dedicated transistor. Similarly, the amplifier circuit comprises a second pair of triplets of transistors having the second threshold voltage. The transistors of each triplet of the second pair of triplets is commonly connected to a respective dedicated transistor of the second pair of matched transistors such that a respective current path is formed with the dedicated transistor.

For example, 12 current paths are formed with the transistors of the first and the second pair of triplets. Each transistor of the first and the second pair of matched transistors is part of the three current paths of the one dedicated triplet. In other words, a current through each of the four transistors of the first and the second pair of matched transistors is split up into three currents by the respective triplet of transistors. For example, the transistors of the triples together form a second differential stage.

The use of transistors with different threshold voltages allows for the correct bias points even when the common mode voltages of both differential stages are the same and the input signal of both differential stages is the same.

A first transistor of each of the triplets of the first and the second pair of triplets has its control terminal connected to the control terminal of the respective dedicated transistor connected in the current path. Furthermore, said first transistor of each of the triplets is matched to a second and a third transistor of the same triplet by a common matching ratio. For example, such a matching ratio is given by a geometry ratio, e.g. a W/L ratio in the case of a field effect transistor. Control terminals of the second and third transistors of each triplet are commonly connected to control terminals of the first transistors of the respective other triplet of the pair. For example, the control terminals of the second and third transistors of a first triplet of the first pair of triplets is connected to the control terminal of the first transistor of the second triplet of the first pair of triplets etc.

The first transistors of the first pair of triplets are connected to the differential current path of the output stage, to the second transistors of the second pair of triplets, and to the respective second transistor of the respective other triplet of the first pair of triplets.

Similarly, the first transistors of the second pair of triplets are connected to a first pair of bias transistors being part of the voltage sources, to the third transistors of the first pair of triplets, to the third transistor of the respective other triplet of the second pair of triplets, and to control terminals of a second pair of bias transistors being part of the voltage sources. Accordingly, the voltage sources that perform the cross-coupling between the first and the second pair of matched transistors, comprise at least the first pair of bias transistors, the second pair of bias transistors and the second pair of matched transistors. For example, one of the first pair of bias transistors forms a current path with one of the second pair of matched transistors and one of the second pair of bias transistors. Additionally, this current path further comprises one of the first transistors of the second pair of triplets. The voltage sources or the transistors comprised by the voltage sources, respectively, may act as level shifters.

Furthermore, a current through the second pair of bias transistors is mirrored to a pair of matched output transistors being arranged in the differential current path of the output stage.

In the present description of transistor connections it is assumed that each transistor has a controlled path, through which current can flow, being controlled by a signal at the control terminal of the transistor. In the case of a field effect transistor, the control terminal is the gate terminal and the controlled path is formed between drain and source of the transistor. In case of a bipolar transistor, for example, the control terminal is the base terminal and the controlled path is formed between collector and emitter. Hence, if a transistor is described as being connected to any node, this means that one terminal connecting the controlled path of the transistor is connected to said node. Hence, with a connection of a transistor to a node, a current path from that node through the transistor may be formed, if not stated otherwise.

In a specific implementation of the amplifier circuit each of the second pair of bias transistors forms respective current paths with one transistor of the first pair of matched transistors and one transistor of the second pair of matched transistors, which have their control terminals connected to different terminals of the differential input. For example, the transistor of the first pair of matched transistors having its control terminal connected to the positive or non-inverting input of the differential input has one of its current terminals connected to one of the current terminals of the transistor of the second pair of matched transistors having its control terminal connected to the negative or inverting input of the differential input. For example, the other current terminal of these transistors is connected to the transistors of the associated or dedicated triplet.

Such a connection between the transistors of the first and the second pair of matched transistors with the transistor of the second pair of bias transistors, for example, serves for implementing the cross-coupling between the two pairs. Additionally, such cross-coupling results in a certain feedback between the two pairs that can be implemented without additional current paths or current mirrors, such that the current consumption can be kept low.

For example, the current consumption of the amplifier circuit can be reduced for the same gain bandwidth product, or an enhanced slew rate and gain bandwidth product can be achieved for the same current consumption.

For example, the first pair of bias transistors is controlled by a common bias voltage.

In specific implementations, the transistors of the second pair of bias transistors and the transistors of the pair of matched output transistors are designed such that a common mirroring ratio is achieved between them. Preferably, a current through the matched output transistors is higher than a current through the transistors of the second pair of bias transistors by a factor defined by the common mirroring ratio.

In some implementations the output stage is implemented as a cascode stage, wherein control terminals of the second pair of bias transistors are respectively connected to control terminals of the pair of matched output transistors. Hence, each one of the matched output transistors and the transistors of the second pair of bias transistors are connected in a current mirror fashion, being controlled by the first transistors of the second pair of triplets. Such an implementation ensures a further reduction of the current consumption as no additional current mirrors are needed.

For example, the cascode stage further comprises at least one pair of cascode transistors, preferably a first pair and a second pair of complimentary type. The cascode transistors may be controlled by a regular biasing stage, providing respective cascode control voltages to the respective pair. As an alternative, the at least one pair of cascode transistors is controlled by a gain boosting stage. With the latter measure, the total gain of the amplifier circuit can be increased.

In other implementations, the output stage can also be implemented as a telescopic stage, wherein the mirroring between the second bias transistors and the matched output transistors may be performed by additional current mirrors. Nevertheless, due to the cross-coupling and current splitting with the triplets, the current consumption still can be kept low.

In some implementations, the voltage sources are implemented as flipped voltage follower cells. For example, each flipped voltage follower cell comprises one transistor of each of the first and the second pair of bias transistors and one transistor of the second pair of matched transistors.

The amplifier circuit may be constituted by transistors that are of metal oxide semiconductor or other field-effect transistor type.

Alternatively, it is also possible to realize at least some of the transistors, for example those of the first and the second pair of matched transistors, using bipolar transistors and building the second differential stage formed by the triplets using metal oxide semiconductor transistors, for example.

The different threshold voltages of the transistors may be realized in at least one of many different ways.

One way to do this is to define the first threshold voltage by a first thickness of the gate oxide of the transistors of the first differential stage. The second threshold voltage is defined by a second thickness of the gate oxide of the transistors of the second differential stage wherein the first thickness is different from the second thickness.

Alternatively or additionally it is possible to use different doping of the transistors in order to achieve different threshold voltages of the transistors.

Further alternatively or additionally, the threshold voltage can be defined by different bulk voltages of the transistors.

It is also possible to implement differential threshold voltages using dual gate transistors with floating gate.

An amplifier circuit according to the improved amplifier concept as described above can be used as a single amplifier stage or as part of more complex amplifier arrangements like a multi-stage amplifier.

For example, an amplifier arrangement according to the improved amplifier concept comprises an input amplifier stage being implemented with an amplifier circuit according to one of the embodiments described above, and an output amplifier stage connected downstream to the input amplifier stage.

For example, such an amplifier arrangement may comprise a frequency compensation block for generating compensation signals provided at least to the input amplifier stage. Such a compensation block may be implemented according to at least one of the following: a Miller cascode, a hybrid cascode or a nested Miller cascode.

An amplifier circuit according to the improved amplifier concept can be used in continuous time circuits or in switched capacitor circuits, without excluding other possible implementations.

BRIEF DESCRIPTION OF THE DRAWINGS

The improved amplifier concept will be described in detail below for several embodiments with reference to the drawings. Identical reference numerals designate elements or components with identical functions. In so far as elements or components correspond to one another in function, a description of them will not be repeated in each of the following figures.

In the figures.

DETAILED DESCRIPTION

Figure 1:
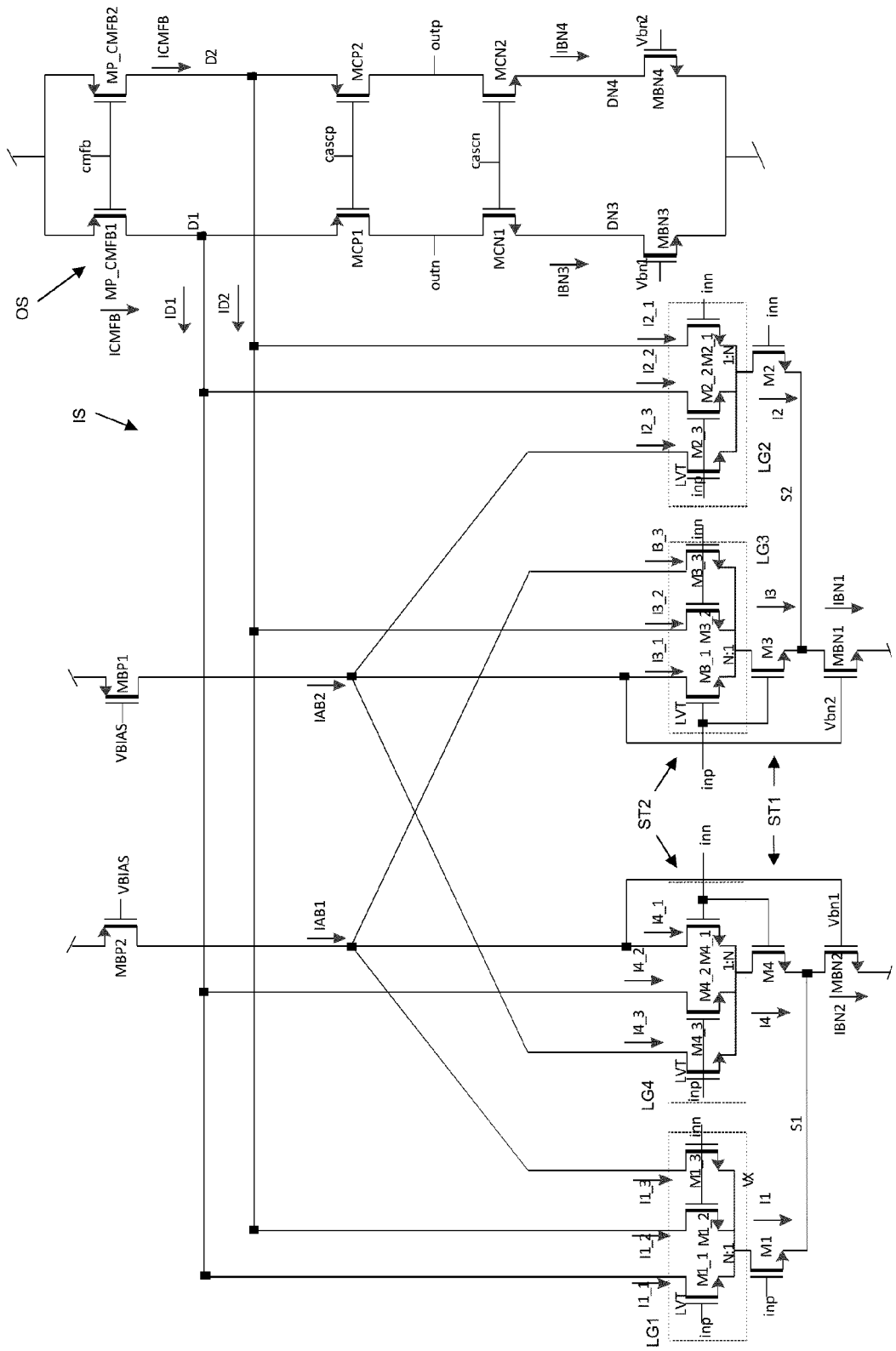
FIG. 1 shows an example schematic of an embodiment of an amplifier circuit according to the improved amplifier concept.

FIG. 1 shows an amplifier circuit according to the improved amplifier concept. The amplifier circuit is formed as a full differential folded cascode class AB amplifier stage having an input stage IS and an output stage OS. The class AB input stage IS is built with two matched input transistors M1, M2 that are cross-coupled with two voltage sources, preferably constant voltage sources. The voltage sources in this implementation are formed by two flipped voltage follower cells, FVF, which are built from a second pair of matched transistors M3, M4, a first pair of bias transistors MBP1, MBP2 and a second pair of bias transistors MBN1, MBN2. In particular, the transistors M4, MBN2 and MBP2 compose the first flipped voltage follower, whereas the second flipped voltage follower is composed by transistors M3, MBN1 and MBP1. The voltage sources or the transistors comprised by the voltage sources, respectively, may act as level shifters.

The transistors M1, M2, M3, M4 have a first threshold voltage. The first transistor M1 of the first pair is coupled with the voltage source in that its source terminal is connected to the source terminal of transistor M4 of the second pair of matched transistors, and to the drain terminal of the bias transistor MBN2, forming a node S1. For establishing a differential operation, the control terminal or gate terminal of transistor M1 is connected to a positive input terminal inp of a differential input, whereas a control terminal or gate terminal of transistor M4 is connected to a negative or inverting input terminal inn of the differential input.

In a similar fashion, the second transistor M2 of the first pair of matched transistors is coupled with the second voltage source in that its source terminal is connected to the source terminal of transistor M3 of the second pair of matched transistors and to the drain terminal of the bias transistor MBN1, forming a node S2.

The transistors M1, M2, M3 and M4 of the first and the second pair of matched transistors form a first differential stage ST1 of the input stage IS. A corresponding second differential stage ST2 of the input stage IS is formed by a first pair of triplets LG1, LG2 of transistors and a second pair of triplets LG3, LG4 of transistors. All of the transistors of the triplets LG1, LG2, LG3 and LG4 have a second threshold voltage that is different from the first threshold voltage. Preferably, the threshold voltages are chosen such that the transistors M1, M2, M3, M4 of the first differential stage ST1 have a higher threshold voltage than the transistors of the second differential stage ST2.

The first triplet LG1 comprises a first transistor M1_1, a second transistor M1_2 and a third transistor M1_3 that have their source connection commonly connected to the drain terminal of transistor M1. In a similar fashion, the second triplet LG2 comprises a first transistor M2_1, a second transistor M2_2 and a third transistor M2_3 having their source terminal connected to the drain terminal of transistor M2.

In a similar composition, also the triplets LG3, LG4 of the second pair of triplets are connected to the dedicated transistor M3, respectively M4. In particular, first transistor M3_1, second transistor M3_2 and third transistor M3_3 of triplet LG3 are commonly connected to the drain terminal of transistor M3, and first transistor M4_1, second transistor M4_2 and third transistor M4_3 of the triplet LG4 are commonly connected to the drain terminal of transistor M4.

The respective first transistor M1_1, M2_1, M3_1 and M4_1 is matched to the corresponding second and third transistors of the same triplet by a common matching ratio N. Hence, the first transistors of each triplet carry N times the current of the second and third transistors, respectively, having the same voltages applied. The gate terminals of said first transistors M1_1, M2_1, M3_1 and M4_1 of each triplet LG1, LG2, LG3, LG4 are connected to the same input terminal of the differential input inp, inn as the dedicated transistor of the first and the second pair of matched transistors M1, M2, M3, M4, to which the triplet is connected. For example, the gate terminal of transistor M1 may be connected to the gate terminal of transistor M1_1, the gate terminal of transistor M2 may be connected to the gate terminal of transistor M2_1 etc.

For example, source terminals of the bias transistors MBP1, MBP2 are connected to a first supply terminal, in particular a positive supply terminal. Source terminals of bias transistors MBN1, MBN2 may be connected to a second supply terminal, for example a negative supply terminal or a ground terminal. The gate terminals of the bias transistors MBP1, MBP2 are controlled by a common bias voltage VBIAS.

The output stage OS of the amplifier circuit is implemented as a cascode stage in this example. Other implementations of the output stage, like a telescopic stage, are not excluded by such example. The output stage is formed by a differential current path having a pair of common mode feedback transistors MP_CMFB1, MP_CMFB2 connected between the first supply terminal and nodes D1, D2 in each path of the differential current path. The pair of transistors MP_CMFB1, MP_CMFB2 are controlled by a common feedback voltage at a node cmfb. The output stage OS further comprises a first and a second pair of cascode transistors MCP1, MCP2 and MCN1, MCN2 that are controlled by respective cascode control voltages cascp and cascn. In this composition, the drain terminals of the cascode transistors MCN1, MCP1 are connected to form a negative output node outn of a differential output of the amplifier circuit. Similarly, the drain terminals of cascode transistors MCN2, MCP2 are connected together to form the positive output node outp of the differential output. A pair of matched output transistors MBN3, MBN4 is arranged in the differential current path of the output stage between the cascode transistors MCN1, MCN2 and the second supply terminal.

In the following, the connection of the transistors of the four triplets LG1, LG2, LG3, LG4 is described. For example, the first transistors M1_1, M2_1 of the first and the second triplet LG1, LG2 are connected to the differential current path of the output stage, in particular to nodes D1, D2, respectively. Node D1 is further connected to the second transistors M2_2 and M4_2 of the second and the fourth triplet LG2, LG4, wherein these transistors M2_2 and M4_2 are controlled by the same control voltage as transistor M1_1. In a symmetrical fashion, node D2 in the output stage OS is connected to the second transistors M1_2 and M3_2 of the first and the third triplet LG1, LG2, these transistors M1_2 and M3_2 being controlled by the same control voltage as transistor M2_1. The latter mentioned transistors connected to the nodes D1, D2 mainly serve the purpose of the differential operation of the amplifier circuit.

The first transistor M3_1 of the third triplet LG3 is connected to the bias transistor MBP1 at its drain terminal, and further to the third transistors M2_3 and M4_3 of the second and fourth triplet LG2, LG4. Bias transistor MBP1 provides a bias current IAB2. In a symmetrical fashion, the first transistor M4_1 of the fourth triplet LG4 is connected to the bias transistor MBP2 at its drain terminal and further to the third transistors M1_3 of the first triplet LG1 and M3_3 of the third triplet LG3. Bias transistor MBP2 provides a bias current IAB1. Additionally, the drain terminal of transistor M4_1 is connected to the gate terminal of bias transistor MBN2. The voltage VBN1 is present at this node, which is also provided to the gate terminal of the output transistor MBN3 in the output stage OS.

Similarly, the drain terminal of the first transistor M3_1 of the third triplet LG3 is connected to the gate terminal or control terminal of the bias transistor MBN1, and to the gate terminal of the output transistor MBN4. In other words, currents IBN1, IBN2 through the transistors MBN1, MBN2 are mirrored to the output transistors MBN4, MBN3 in order to produce currents IBN4 and IBN3. This mirroring is performed with a common mirroring ratio M such that the current capability of the transistors MBN3, MBN4 in the output stage OS is M times higher than that of the transistors MBN1, MBN2 in the input stage IS. Hence, the latter mentioned transistors connected to the bias transistors mainly serve the purpose of the class AB operation of the amplifier circuit. Furthermore, respective positive feedback loops are formed by these transistors.

According to the above description of the various connections of the transistors, each of the transistors in one triplet forms a respective current path with the dedicated transistor in the first differential stage ST1, namely the transistors of the first and the second pair of matched transistors M1, M2, M3, M4. In other words, the current flowing through each of the transistors M1, M2, M3, M4 is split by three respective differential input voltage controlled current sources, respectively. Furthermore, the currents I1, I4 through transistors M1, M4 are combined to current IBN2 through bias transistor MBN2. Similarly, currents I2, I3 through transistors M2, M3 are combined to current IBN1 through bias transistor MBN1. Expressed as formulas, this can be written as $$I1=I1\_1+I1\_2+I1\_3$$

$$I2=I2\_1+I2\_2+I2\_3$$

$$I3=I3\_1+I3\_2+I3\_3$$

$$I4=I4\_1+I4\_2+I4\_3$$

and $$IBN1=I2+I3$$

$$IBN2=I1+I4$$

Further considering the circuit in FIG. 1, output currents Ioutp, Ioutn flowing through the positive output outp and the negative output outn are:

$$Ioutp=ICMFB-IBN4-I2\_1-I1\_2-I3\_2$$

$$Ioutn=ICMFB-IBN3-I1\_1-I2\_2-I4\_2$$

Additionally it is given that
Appling Kirchhoff's law in connection nodes Vbn1 and Vbn2:

$$0=IB-I4\_1-I1\_3-I3\_3$$

$$0=IB-I3\_1-I2\_3-I4\_3$$

In the quiescent condition, where a voltage vinp at the node inp is equal to a voltage vinn at the node inn and Ioutp=Ioutn=0, and choosing $$I1\_1=I2\_1=I3\_1=I4\_1=2\cdot I$$

and $$I1\_2=I1\_3=I2\_2=I2\_3=I3\_2=I3\_3=I4\_2=I4\_3=I$$

this will result in $$IBN1=IBN2=I2+I3=8\cdot I\ IB=4\cdot I$$

assuming that bias current sources MBP1, MBP2 provide currents IAB1=IAB2=IB in the quiescent condition.
Hence, $$Ioutp=ICMFB-M\cdot 8\cdot I-4\cdot I$$

$$Ioutn=ICMFB-M\cdot 8\cdot I-4\cdot I$$

wherein, being ICMFB the current provided by the transistors MP_CMFB1, MP_CMFB2 and being M the geometry ratio between MB3, MB4 and MB1, MB2:

$$ICMFB=M\cdot 8\cdot I+4\cdot I$$

The class-AB operation is enhanced by speeding-up the charge/discharge of the internal nodes Vbn1 and Vbn2, which control the current flowing through each input pair MBN1, MBN2 and the current sources MBN3, MBN4 at the output stage OS. The speeding-up is built by reusing the current flowing through the main differential pair M1, M2 when a differential input is applied by cross-coupling the voltage controlled current sources in both the differential pair and the voltage sources.

When a positive differential voltage is applied at the differential input, i.e. a voltage vinp at the node inp is greater than a voltage vinn at the node inn, the drain current I1 will be increased due to the fact that currents I4_2 and I2_2 will be reduced due to the fact that M4_2 and M2_2 are connected to M4 and M2, respectively, which have their gate terminals connected to node inn. The currents I1_3 and I3_3 are also reduced because of the connection of M1_3 and M3_3 to the node inn. The bias current IAB1 will flow completely to the node Vbn1. Thus, the current IBN2 will be increased and the voltage at node Vbn1 will raise up. This implies an increase in the current IBN3 enhancing the discharge of the node outn.

In the opposite way, the drain current I2 will be reduced due to currents I1_2 and I3_2. This current reduction will imply a fall of the voltage at node Vbn2. The current IBN4 will be reduced enhancing the charge of the output node outp.

Thus, considering a small signal differential voltage dvin at the input nodes inp and inn, the voltage shift dVx at the node Vx is:

$$N\cdot(dvin-dVx)=2\cdot(dvin+dVx) \to dVx=\left(\frac{N-2}{N+2}\right)\cdot dvin$$

Taking the latter relationship, and being gm1 the transconductance of transistors M1, M2, M3 and M4 and gm2 the transconductance of the transistors in the triplets LG1, LG2, LG3, LG4, the currents through each branch are:

$$I1\_1 = \frac{N}{N+2}gm1 \cdot vin + gm2 \cdot N \cdot (dvin - dVx)$$
$$= \frac{N \cdot gm1 + 4 \cdot N \cdot gm2}{(2+N)}dvin$$
$$= I3\_1 = -I4\_1 = -I2\_1$$

$$I1\_2 = \frac{1}{N+2}gm1 \cdot dvin + gm2 \cdot (-dvin - dVx)$$
$$= \frac{gm1 - 2 \cdot N \cdot gm2}{(2+N)}dvin$$
$$= I1\_3 = -I4\_2 = -I4\_3 = I3\_2 = I3\_3\_ = -I2\_2 = -I2\_3$$

This results in:

$$ID1 = I1\_1 + I4\_2 + I2\_2 = \frac{(N-2) \cdot gm1 + 8 \cdot N \cdot gm2}{(2+N)} \cdot dvin$$
$$= -ID2 = -IAB1 = IAB2$$

The total differential output current $IOUT_{diff}$ is:

$$IOUT_{diff} =$$
$$(ID1 - ID2) - (IAB1 - IAB2) = 4 \cdot \left(\frac{(N-2) \cdot gm1 + 8 \cdot N \cdot gm2}{(2+N)}\right) \cdot dvin$$

For example, taking N=2 and assuming that gm1≈(N+2)·gm2, this results in:

$$IOUT_{diff} = 4 \cdot \left(\frac{16 \cdot gm2}{4}\right) \cdot dvin = 16 \cdot gm2 \cdot vin \cong 4 \cdot gm1 \cdot dvin$$

Similarly, taking N=4 and assuming that gm1≈(N+2)·gm2, this results in:

$$IOUT_{diff} = 2 \cdot \left(\frac{2 \cdot gm1 + 32 \cdot gm2}{3}\right) \cdot dvin \cong 4.88 \cdot gm1 \cdot dvin$$

An optimum value of the common matching ratio N may, for example, be found by calculating the maximum gain when sweeping the value of N. For example the maximum gain can be defined by observing the differential output current in relation to the transconductance gm1, or the total transconductance of the amplifier circuit in relation to the transconductance gm1.

Figure 2:
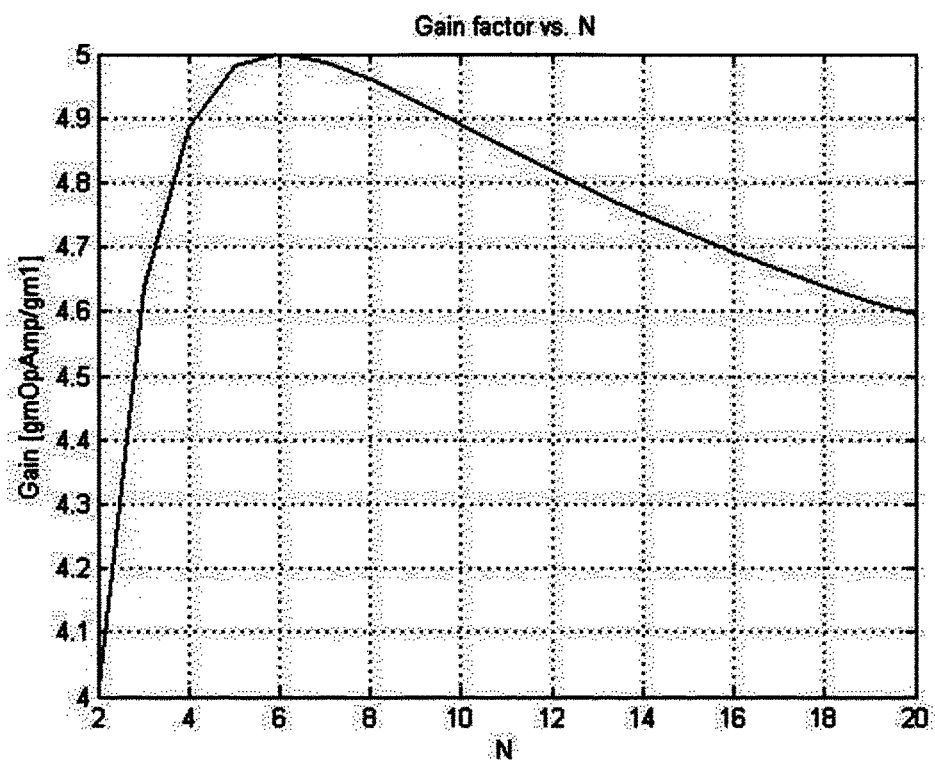
FIG. 2 shows an example signal diagram of gain factors.

For example, FIG. 2 shows a diagram of different values for the matching factor N versus normalized gain of the amplifier. In this example configuration, a maximum gain can be found for the value N=6. However, this value can change with varying parameters of the amplifier circuit.

In the example implementation of FIG. 1, the amplifier circuit is built with field effect transistors, wherein the differential stages are formed with n-channel field effect transistors as well as the second pair of bias transistors MBN1, MBN2. The first pair of bias transistors MPB1, MPB2 is built with p-channel field effect transistors, etc. In a possible complementary implementation, all of the n-channel field effect transistors may be replaced by p-channel field effect transistors and vice versa. A specific implementation will become apparent for the skilled person from the above description.

In further alternative implementations all or some of the transistors being implemented as field effect transistors may be replaced by bipolar transistors, as long as it is ensured that the transistors of the first differential stage, here M1, M2, M3, M4, have a higher threshold voltage than a threshold voltage of transistors in the second differential stage, here the transistors in the triplets LG1, LG2, LG3, LG4.

The cascode control voltages cascp and cascn, which control the first and the second pair of cascode transistors MCP1, MCP2 and MCN1, MCN2, may be generated by a regular biasing circuit. As an alternative, the cascode control voltages cascp and cascn may also be generated with gain enhancement. For example, additional gain boosting stages may be provided that are connected to the source terminals of cascode transistors MCP1, MCP2 and MCN1, MCN2 at their input side and that provide the cascode control voltages cascp and cascn based thereon. With such measure, the total gain of the amplifier circuit can be increased.

In the various implementations of the improved amplifier concept with the current-based boost scheme, no additional current paths or extra current mirrors are necessary. Hence, the current consumption of the amplifier circuit is reduced compared to such conventional implementations. Therefore, the same gain bandwidth product and/or slew rate can be achieved with less current consumption. Similarly, the gain bandwidth product and the slew rate of the amplifier circuit can be increased without increasing the current consumption.

An amplifier circuit as shown, for example, in FIG. 1, can be used as a single amplifier stage or as an amplifier in a multistage amplifier. For example, the amplifier circuit can be used as a single-ended operational amplifier having only one output node. In this case, for example the node cmfb would be connected to the node D1 or to the node outn, such that the node outp is the single-ended output.

In the configuration as shown in FIG. 1, the amplifier circuit can be used as a differential operational amplifier. The amplifier circuit may be used in continuous time circuits or in switched capacitor circuits.

The amplifier circuit can also be used in active filters, in continuous time integrators, in analog-to-digital converters etc.

In one specific implementation, an amplifier circuit according to the improved amplifier concept may be used in a multistage, for example two-stage amplifier, preferably with a corresponding frequency compensation.

Figure 3:
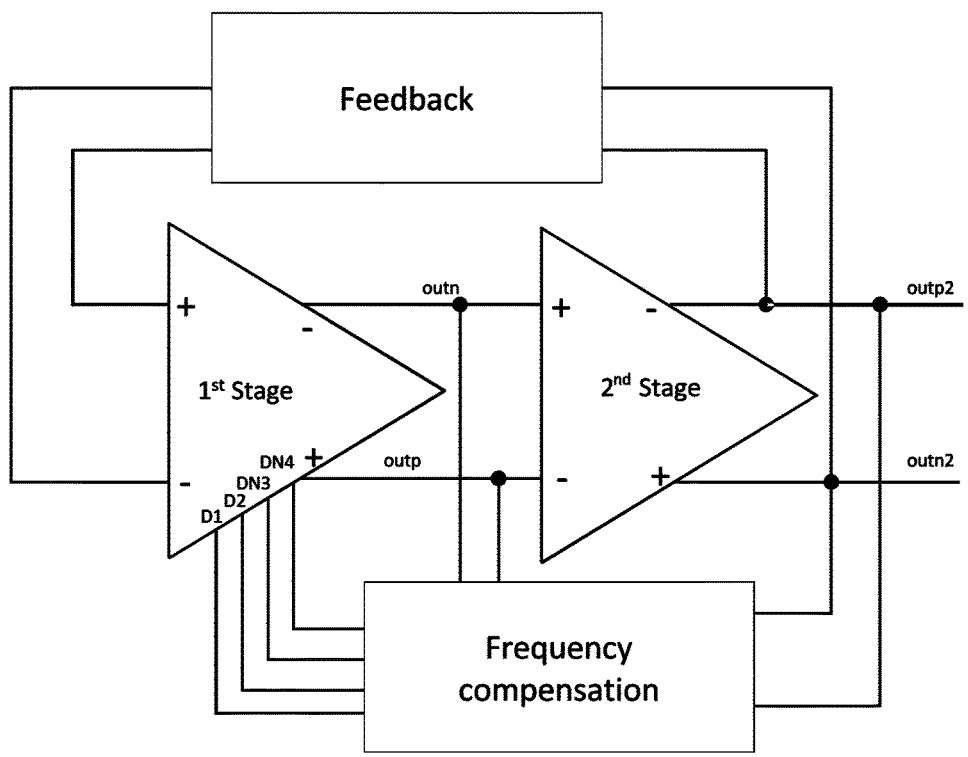
FIG. 3 shows an example implementation of an amplifier arrangement according to the improved amplifier concept.

For example, FIG. 3 shows such an implementation with a first amplifier stage being implemented with an amplifier circuit according to the improved amplifier concept, for example according to FIG. 1, and with a second amplifier stage connected downstream to the first stage. The differential output outp2, outn2 of the multistage amplifier arrangement is connected to the output of the second stage. The arrangement comprises a frequency compensation block being connected to the output terminals outp2, outn2 and to intermediate output terminals outn, outp at its input side and to nodes D1, D2, DN3, DN4 of the first amplifier stage at its output side. The frequency compensation block may be implemented according to various possible solutions, like a Miller cascode, a hybrid cascode or a nested Miller cascode. Furthermore, feedback circuitry can be provided for determining the characteristics of the two-stage amplifier arrangement.

The invention claimed is:

1. An amplifier circuit with a differential input and a differential output arranged in a differential current path of an output stage, the amplifier circuit comprising:
   a first pair of matched transistors having a first threshold voltage and comprising control terminals connected to the differential input;
   a second pair of matched transistors having the first threshold voltage and comprising control terminals connected to the differential input, said second pair being part of voltage sources cross-coupling said first pair of matched transistors;
   a first pair of triplets of transistors having a second threshold voltage being different from the first threshold voltage, the transistors of each triplet being commonly connected to a respective dedicated transistor of the first pair of matched transistors such that a respective current path is formed with the dedicated transistor;
   a second pair of triplets of transistors having the second threshold voltage, the transistors of each triplet being commonly connected to a respective dedicated transistor of the second pair of matched transistors such that a respective current path is formed with the dedicated transistor;
wherein
   a first transistor of each of the triplets has its control terminal connected to the control terminal of the respective dedicated transistor connected in the current path and is matched to a second and a third transistor of the same triplet by a common matching ratio;
   control terminals of the second and third transistors of each triplet are commonly connected to control terminals of the first transistors of the respective other triplet of the pair;
   the first transistors of the first pair of triplets are connected to the differential current path of the output stage, to the second transistors of the second pair of triplets, and to the respective second transistor of the respective other triplet of the first pair of triplets;
   the first transistors of the second pair of triplets are connected to a first pair of bias transistors being part of the voltage sources, to the third transistors of the first pair of triplets, to the third transistor of the respective other triplet of the second pair of triplets and to control terminals of a second pair of bias transistors being part of the voltage sources; and
   a current through the second pair of bias transistors is mirrored to a pair of matched output transistors being arranged in the differential current path of the output stage.

2. The amplifier circuit according to claim 1, wherein each of the second pair of bias transistors forms respective current paths with one transistor of the first pair of matched transistors and one transistor of the second pair of matched transistors, which have their control terminals connected to different terminals of the differential input.

3. The amplifier circuit according to claim 1, wherein the first pair of bias transistors is controlled by a common bias voltage.

4. The amplifier circuit according to claim 1, wherein the transistors of the second pair of bias transistors and the transistors of the pair of matched output transistors are designed such that a common mirroring ratio is achieved between them.

5. The amplifier circuit according to claim 1, wherein the output stage is implemented as a cascode stage and control terminals of the second pair of bias transistors are respectively connected to control terminals of the pair of matched output transistors.

6. The amplifier circuit according to claim 5, wherein the cascode stage comprises at least one pair of cascode transistors.

7. The amplifier circuit according to claim 6, wherein the at least one pair of cascode transistors is controlled by a gain boosting stage.

8. The amplifier circuit according to claim 1, wherein the voltage sources are implemented as flipped voltage follower cells.

9. An amplifier arrangement comprising:
   an input amplifier stage being implemented with an amplifier circuit according to claim 1; and
   an output amplifier stage connected downstream to the input amplifier stage.

10. The amplifier arrangement according to claim 9, further comprising a frequency compensation block for generating compensation signals provided at least to the input amplifier stage.

11. The amplifier arrangement according to claim 10, wherein the frequency compensation block is implemented according to at least one of the following: a Miller cascode, a hybrid cascode, a nested Miller cascode.

12. A continuous time circuit with an amplifier circuit according to claim 1.

13. A switched capacitor circuit with an amplifier circuit according to of claim 1.

* * * * *